US009389786B2

(12) United States Patent
Tsai et al.

(10) Patent No.: US 9,389,786 B2
(45) Date of Patent: Jul. 12, 2016

(54) MEMORY DEVICE WITH TRACKING MECHANISM

(71) Applicant: TAIWAN SEMICONDUCTOR MANUFACTURING COMPANY, LTD., Hsinchu (TW)

(72) Inventors: Ming-Chien Tsai, Kaohsiung (TW); Yu-Hao Hsu, Tainan (TW); Chih-Yu Lin, Taichung (TW); Chen-Lin Yang, Zhubei (TW); Cheng Hung Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 42 days.

(21) Appl. No.: 14/300,750

(22) Filed: Jun. 10, 2014

(65) Prior Publication Data

US 2015/0277770 A1 Oct. 1, 2015

Related U.S. Application Data

(60) Provisional application No. 61/972,898, filed on Mar. 31, 2014.

(51) Int. Cl.
*H03M 13/00* (2006.01)
*G06F 3/06* (2006.01)

(52) U.S. Cl.
CPC ............ *G06F 3/0604* (2013.01); *G06F 3/0653* (2013.01); *G06F 3/0679* (2013.01)

(58) Field of Classification Search
CPC ... G06F 3/0604; G06F 3/0679; G06F 3/0653; G11C 16/28; G11C 7/1027; G11C 7/08; G11C 7/14; G11C 8/12; G11C 13/0002; G11C 13/0007; G11C 13/0023; G11C 13/0028; G11C 16/08; G11C 16/26; G11C 13/004; G11C 2013/0054; G11C 2213/18; G11C 2213/71
See application file for complete search history.

(56) References Cited

U.S. PATENT DOCUMENTS

| | | | | |
|---|---|---|---|---|
| 8,988,946 | B1 * | 3/2015 | D'Abreu | G11C 16/28 365/185.08 |
| 2003/0156457 | A1 * | 8/2003 | Ooishi | G11C 11/5671 365/185.21 |
| 2004/0042275 | A1 * | 3/2004 | Yoshizawa | G11C 7/06 365/189.07 |
| 2005/0063238 | A1 * | 3/2005 | Nambu | G11C 11/406 365/222 |
| 2008/0101143 | A1 * | 5/2008 | Jung | G11C 7/08 365/210.1 |
| 2008/0232184 | A1 * | 9/2008 | Ohsawa | G11C 8/04 364/207 |
| 2008/0298143 | A1 * | 12/2008 | Chen | G11C 7/22 365/194 |
| 2010/0061162 | A1 * | 3/2010 | Burnett | G11C 7/04 365/189.09 |
| 2010/0284232 | A1 * | 11/2010 | Wang | G11C 8/08 365/194 |
| 2012/0206983 | A1 * | 8/2012 | Zhang | G11C 11/419 365/194 |
| 2013/0070538 | A1 * | 3/2013 | Sugamoto | G11C 7/08 365/189.05 |
| 2013/0164894 | A1 * | 6/2013 | Kim | H01L 27/11551 438/269 |
| 2014/0119130 | A1 * | 5/2014 | Trivedi | G11C 7/08 365/189.02 |

* cited by examiner

*Primary Examiner* — Guerrier Merant
(74) *Attorney, Agent, or Firm* — Hauptman Ham, LLP

(57) ABSTRACT

A memory device includes storage layers each comprising memory cells arranged in a plurality of rows, bit lines coupled to the memory cells in the corresponding rows, tracking cells arranged in at least one row, at least one tracking bit line coupled to the tracking cells, and at least one sense amplifier coupled to the bit lines. The sense amplifier is configured to detect data stored in the memory cells, and has an enabling terminal coupled to the at least one tracking bit line. The memory device further comprises word lines and tracking word lines extending through the storage layers. The word lines are coupled to the corresponding memory cells in the storage layers. The tracking word lines are coupled to the corresponding tracking cells in the storage layers.

20 Claims, 12 Drawing Sheets

MEMORY DEVICE WITH TRACKING MECHANISM

PRIORITY CLAIM

The instant application is a non-provisional application claiming the benefit of Provisional Application No. 61/972,898, filed Mar. 31, 2014. The entire content of Provisional Application No. 61/972,898 is incorporated by reference herein.

BACKGROUND

Processors and memories are various parts of computing systems and electronic devices. The performance of a memory impacts the overall performance of the system or electronic device. Various circuits are developed to improve one or more aspects of memory performance, such as capacity, access speed, data integrity, power consumption and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
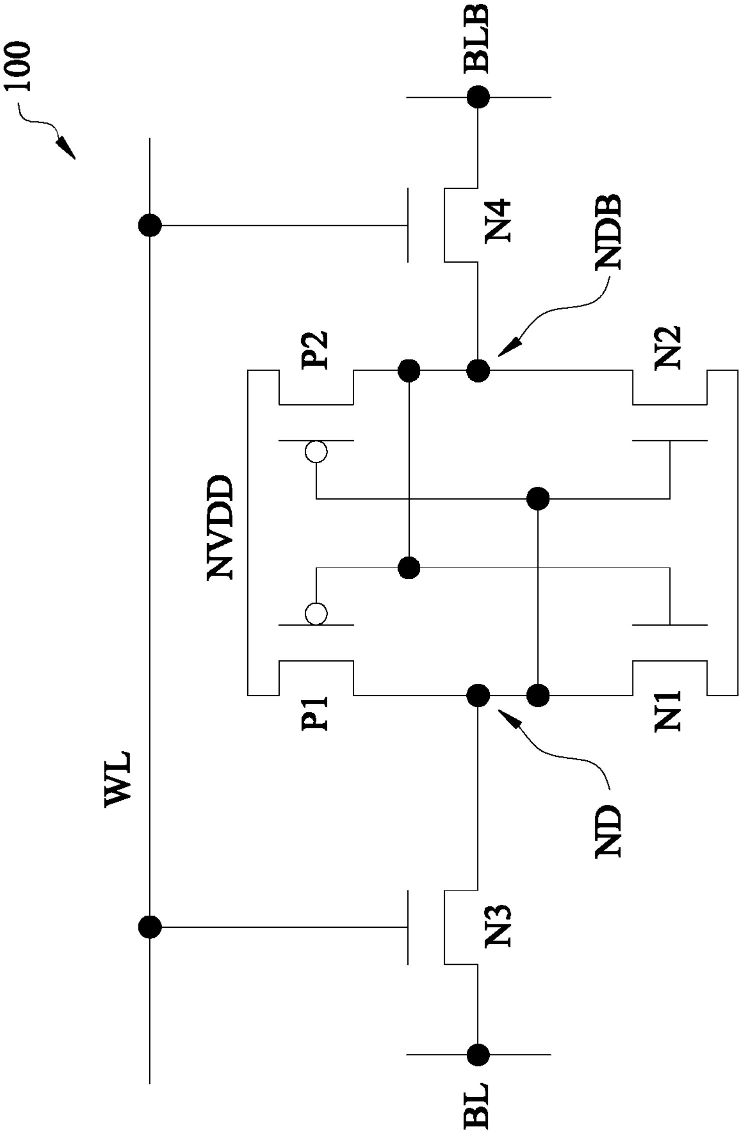
FIG. 1 is a schematic diagram of a memory cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a first element is described as being “connected” or “coupled” to a second element, such description includes embodiments in which the first and second elements are directly connected or coupled to each other, and also includes embodiments in which the first and second elements are indirectly connected or coupled to each other with one or more other intervening elements in between.

FIG. 1 is a schematic diagram of a memory cell 100 for a memory device in accordance with some embodiments. Memory cell 100 is a six transistor (6T) static random access memory (SRAM) cell in this specific example configuration. Other types of memory are within the scope of various embodiments. For example, a memory device in accordance with one or more embodiment includes eight transistor (8T) static random access memory (SRAM) memory cells.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

Sources of transistors P1 and P2 are coupled together and serve as a node NVDD having a supply voltage VDD (not labeled). A drain of transistor P1 is coupled with a drain of transistor N1, a gate of transistor P2, a gate of transistor N2, and a source of transistor N3, and serves as a storage node ND. A drain of transistors P2 is coupled with a drain of transistor N2, a gate of transistor P1, a gate of transistor N1, and a source of transistor N4, and serves a storage node NDB. Sources of transistors N1 and N2 are coupled together and serve as a supply reference voltage node NVSS having a supply reference voltage VSS (not labeled).

A word line WL is coupled with a gate of each of transistors N3 and N4. In a row having memory cells 100, word line WL is coupled with the gate of each of transistors N3 and N4 of the plurality of memory cells 100 in the row. Word line WL is also called a write control line because a signal on word line WL is used to control transistors N3 and N4 for the data to be transferred between bit lines BL, BLB and corresponding nodes ND, NDB.

A drain of transistor N3 is coupled to a bit line BL of a bit line pair. A drain of transistor N4 is coupled to another bit line BLB of the bit line pair. In a column having a plurality of memory cells 100, bit lines BL and BLB are coupled with each drain of corresponding transistors N3 and N4 of the plurality of memory cells 100 in the column.

Bit lines BL and BLB serve as both data input and output for memory cell 100. In some embodiments, in a write operation, applying a logical value to a first bit line and the opposite logical value to the other bit line enables writing the logical values on the bit lines to memory cell 100. Each of bit lines BL and BLB is also called a data line because the data carried on bit lines BL and BLB are written to and read from corresponding nodes ND and NDB.

In a write operation of memory cell 100, applying a logical value to a first bit line, such as bit line BL, and the opposite logical value to the other bit line, such as bit line BLB, enables writing the logical values at bit lines BL and BLB to nodes ND and NDB, respectively. Word line WL is then activated to turn on transistors N3 and N4, which electrically couples node ND to bit line BL and node NDB to bit line BLB. Activating word line WL transfers the data on bit lines BL and BLB to nodes ND and NDB, respectively.

In a read operation, bit lines BL and BLB are pre-charged to a high logical value. Word line WL is then activated to turn on transistors N3 and N4. As a result, node ND is electrically coupled with bit line BL and node NDB is electrically coupled with bit line BLB. Based on a low logical value of the data stored in a corresponding node ND or NBD, one bit line is pulled towards a low logical value and the other bit line remains at the same pre-charged high logical value. A bit line split between bit lines BL and BLB develops. When the bit line split is sufficiently large, a sense amplifier is turned on to sense the developed bit line split between bit lines BL and BLB and reveals the data stored in nodes ND and NDB.

To illustrate a read operation, node ND stores a low logical value, and node NDB stores a high logical value. As a result, PMOS transistor P2 is on, NMOS transistor N2 is off, PMOS transistor P1 is off, and NMOS transistor N1 is on. Because bit line BLB is logically high, node NDB via the turned-on PMOS transistor P2 remains at the high logical value. When word line WL is activated for a read operation, transistor N3 is turned on. Because both transistors N1 and N3 are turned on, bit line BL is pulled towards reference voltage VSS or ground at the source of NMOS transistor N1. As bit line BLB stays at the same high logical value and bit line BL is pulled towards a low logical value, a bit line split between bit lines BL and BLB develops. When the bit line split is sufficiently large, a sense amplifier is turned on to sense the bit line split. The sense amplifier recognizes bit line BL being pulled towards a low logical value. As a result, the sense amplifier recognizes that node ND stores a low logical value and node NDB stores a high logical value.

When node ND stores a high logical value, node NDB stores a low logical value. Sensing node ND storing a high logical value is similar to sensing node NDB storing a low logical value. Operations to sense node NDB having a low logical value with references to NMOS transistors N2, N4 and bit line BLB are similar to operations to sense node ND having a low logical value with references to NMOS transistors N1, N3 and bit line BL as explained above.

As discussed herein, in a read operation, when the bit line split is sufficiently developed, a sense amplifier is turned on, or enabled, to sense the bit line split and to detect the data stored in the memory cell. When the sense amplifier is enabled early or late, performance of the memory device is potentially deteriorated. In some embodiments, a tracking mechanism is provided to enable the sense amplifier when the bit line split is sufficiently developed.

Figure 2A:
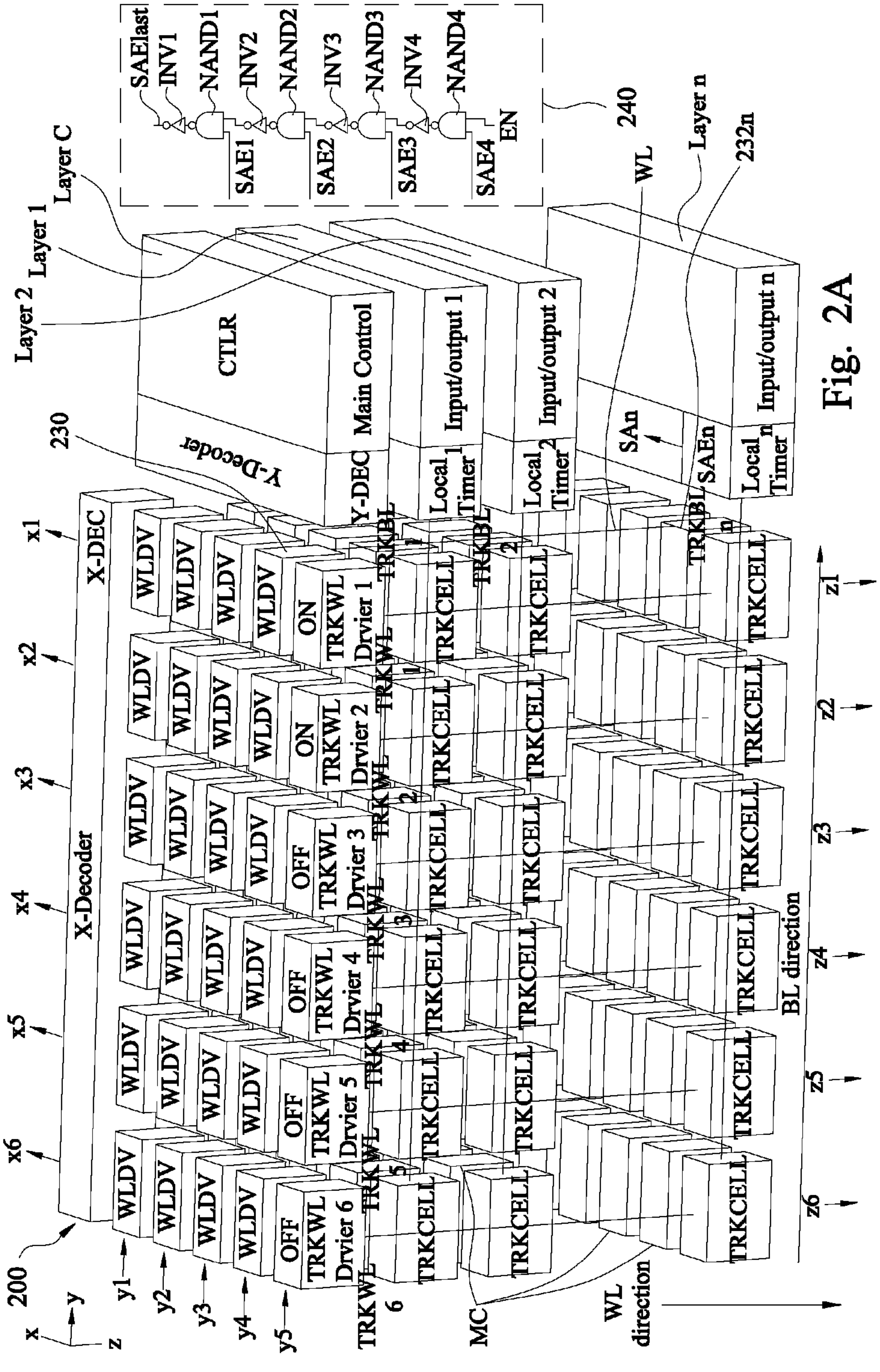
FIG. 2A is a schematic, perspective view of a memory device with a tracking mechanism in accordance with some embodiments.

FIG. 2A is a schematic, perspective view of a memory device 200 with a tracking mechanism in accordance with some embodiments. The memory device 200 comprises a plurality of layers arranged parallel to an X-Y plane. The layers include a control layer indicated in FIG. 2A as Layer C, and storage layers indicated in FIG. 2A as Layer 1, Layer 2, . . . Layer n, where n is a positive integer. The layers C, 1, 2 . . . n are stacked one on top another in the Z direction. The order of layers as illustrated in FIG. 2A is an example. Other orders of the layers are within the scope of various embodiments. In some embodiments, the memory device 200 includes a number of dies (not shown in FIG. 2A). Each of the dies contains one or more of the layers C, 1, 2 . . . n. The dies are stacked one on top another in the Z direction into a three-dimensional (3D) memory device.

Each of Layer 1, Layer 2, . . . or Layer n includes memory cells (also referred to as bitcells) MC, tracking cells TRKCELL, bit lines, at least one tracking bit line correspondingly designated as TRKBL1, TRKBL2, . . . or TRKBLn, a local timer (e.g., a logic circuit) correspondingly designated as Local Timer 1, Local Timer 2, . . . or Local Timer n, at least one sense amplifier (the sense amplifier SAn of Layer n is visible in FIG. 2A), and an input/output circuit correspondingly designated as Input/Output 1, Input/Output 2, . . . or Input/Output n. In at least one embodiment, the tracking cells TRKCELL have the same configuration, and/or are manufactured by the same process, as the memory cells MC in the same storage layer. Additionally or alternatively, the tracking bit lines have the same configuration, and/or are manufactured by the same process, as the bit lines in the same storage layer.

Figure 2B:
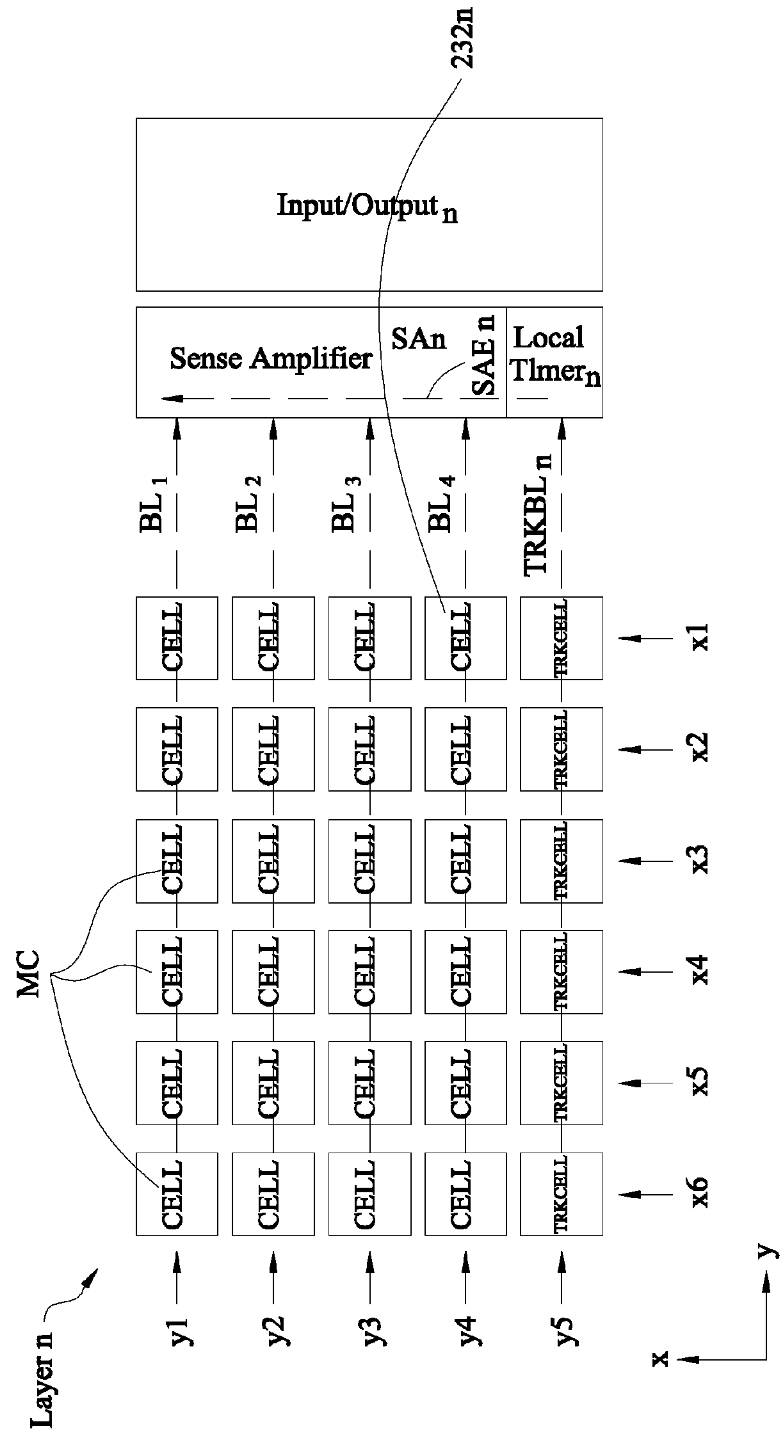
FIG. 2B is a top view of a storage layer in a memory device in accordance with some embodiments.

FIG. 2B is a top view of Layer n in accordance with some embodiments. The other storage layers, i.e., Layer 1, Layer 2, etc. are configured similarly to Layer n. As illustrated in FIG. 2B, Layer n includes memory cells MC, and tracking cells TRKCELL. In at least one embodiment, the memory cells MC have the configuration of the memory cells MC 100 as described with respect to FIG. 1. The memory cells MC are arranged in an array along the x direction and y direction. In the specific configuration illustrated in FIGS. 2A-2B, the memory cells MC are arranged along rows x1, x2, . . . x6, and also along rows y1, y2, y3 and y4. The tracking cells TRKCELL are arranged along a row y5. The numbers of rows in the x direction and/or y direction are examples. Other numbers of rows in the x direction and/or y direction are within the scope of various embodiments. The memory cells MC in each row y1, y2, y3 or y4 are connected to each other by corresponding bit lines BL1-BL4. The direction of the bit lines BL1-BL4 is the Y direction which is indicated in FIG. 2A as "BL direction." The tracking cells TRKCELL in row y5 are connected to each other by the corresponding tracking bit line TRKBLn. Although the specific configuration in FIG. 2B includes one tracking bit line per storage layer, other numbers of tracking bit lines per storage layer are within the scope of various embodiments.

As illustrated in FIG. 2B, each of the bit lines BL1-BL4 corresponds to either one, or both, of the bit lines BL and BLB described with respect to FIG. 1. The bit lines BL1-BL4 are coupled to at least one sense amplifier SAn, which is configured to detect the data stored in the memory cells MC. An output of the sense amplifier SAn is coupled to Input/Output n which is configured to input/output data to/from the memory cells MC. In at least one embodiment, each of the bit lines BL1-BL4 is coupled to a separate sense amplifier. In one or more embodiments, more than one of the bit lines BL1-BL4 are coupled to a common sense amplifier via a multiplexer as described herein. The tracking bit line TRKBLn is coupled to an input of the Local Timer n. The Local Timer n has an output coupled to an enabling terminal of the sense amplifier SAn. The Local Timer n is configured to generate an enabling signal SAEn to enable the sense amplifier SAn. In some embodiments where the Layer n includes multiple sense amplifiers, the enabling signal SAEn is commonly supplied to the enabling terminals of the sense amplifiers. In at least one embodiment, the enabling terminal of the sense amplifier SAn is a gate terminal of an NMOS transistor coupled between a sensing circuit of the sense amplifier and the ground, and the sense amplifier SAn is enabled when the enabling signal SAEn is high or at logical "1." Other arrangements are within the scope of various embodiments.

Figure 2C:
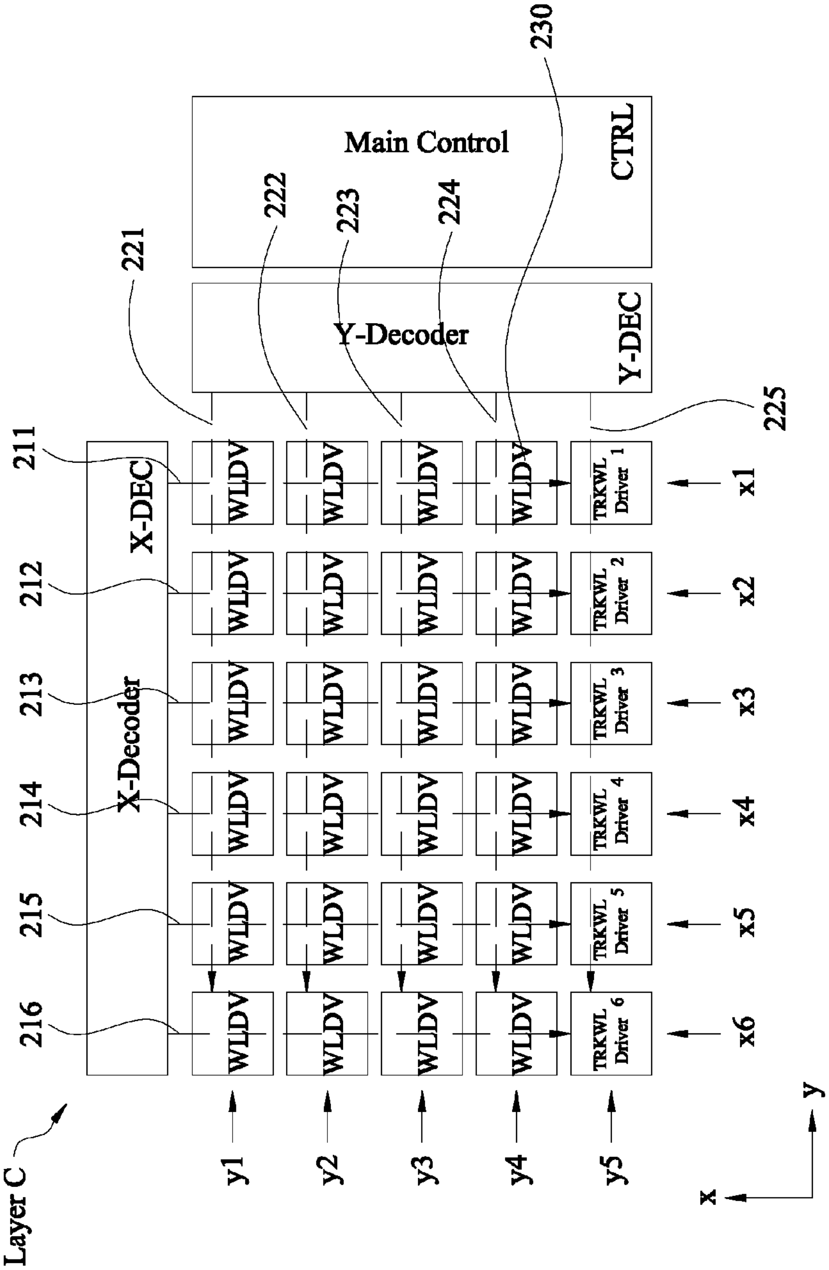
FIG. 2C is a top view of a control layer in a memory device in accordance with some embodiments.

FIG. 2C is a top view of Layer C in accordance with some embodiments. Layer C includes word line drivers WLDV, tracking word line drivers TRKWL Driver 1-TRKWL Driver 6, an X-Decoder X-DEC, a Y-Decoder Y-DEC and a main control CTRL. The word line drivers WLDV are arranged in an array along the x direction and y direction corresponding to the memory cells MC in the storage layers. In the specific configuration illustrated in FIG. 2C, the word line drivers WLDV are arranged along rows x1, x2, . . . x6, and also along rows y1, y2, y3 and y4. The TRKWL Drivers 1-6 are arranged along row y5. X-DEC is coupled to the word line drivers WLDV in rows x1, x2, . . . x6 via corresponding X-address signal lines 211-216. Y-DEC is coupled to the word line drivers WLDV in rows y1, y2, . . . y4 via corresponding Y-address signal lines 221-224. X-DEC and Y-DEC are configured to decode and supply corresponding X- and Y-addresses to selected a corresponding word line driver WLDV in an access operation, e.g., a read operation. The main control CTRL is coupled to X-DEC, Y-DEC and Input/Output 1, Input/Output 2, . . . and Input/Output n to control the overall operation of the memory device 200.

As illustrated in FIG. 2C, TRKWL Driver 1-TRKWL Driver 6 arranged along row y5 are coupled to Y-DEC via a Y-address signal line 225, and are further coupled to X-DEC via corresponding X-address signal lines 211-216 to enable selection of one or more of TRKWL Driver 1-TRKWL Driver 6 by corresponding X- and Y-addresses supplied by X-DEC and Y-DEC. In some embodiments, TRKWL Driver 1-TRKWL Driver 6 are free of direct electrical connections with each other and/or with X-DEC and/or with Y-DEC. For example, in at least one embodiment, the Y-address signal line 225 is omitted and/or one or more of the X-address signal lines 211-216 are not coupled to the corresponding TRKWL Driver 1-TRKWL Driver 6.

In some embodiments, at least one of the tracking word line drivers is configured, e.g., hardwired, to be selected (or enabled) in a read operation of any of the memory cells MC of the memory device 200. Such a tracking word line driver is referred to as an ON TRKWL Driver. For example, in the specific configuration illustrated in FIG. 2A, TRKWL Driver 1 and TRKWL Driver 2 are ON TRKWL Drivers. In some embodiments, at least one of the tracking word line drivers is configured, e.g., hardwired, to be unselected (or disabled) in a read operation of any of the memory cells MC of the memory device 200. Such a tracking word line driver is referred to as an OFF TRKWL Driver. For example, in the specific configuration illustrated in FIG. 2A, TRKWL Driver 3-TRKWL Driver 6 are OFF TRKWL Drivers.

Returning to FIG. 2A, each of the word line drivers WLDV and the corresponding memory cells MC in Layer 1, Layer 2, . . . and Layer n are coupled by a word line. An example word line WL is illustrated in FIG. 2A. The word line WL couples WLDV 230 (also shown in FIG. 2C) with one corresponding memory cell MC in each of Layer 1, Layer 2, . . . or Layer n. For example, a corresponding memory cell MC in Layer n that is coupled to the word line WL is designated as 232*n* in FIGS. 2A and 2B. The word lines extend through the Layer 1, Layer 2, . . . and Layer n in the Z direction. The direction of the word lines is indicated in FIG. 2A as "WL direction." TRKWL Drives 1-TRKWL Driver 6 and the corresponding tracking cells TRKCELL of Layer 1, Layer 2, . . . and Layer n in corresponding columns z1-z6 are coupled by corresponding tracking word lines TRKWL 1-TRKWL 6. For example, TRKWL Driver 1 and the corresponding tracking cells TRKCELL of Layer 1, Layer 2, . . . and Layer n arranged along column z1 are coupled to tracking word line TRKWL 1. The tracking word lines TRKWL 1-TRKWL 6 extend through the Layer 1, Layer 2, . . . and Layer n, in parallel with the word line WL. In at least one embodiment, the tracking word line drivers TRKWL Driver 1-TRKWL Driver 6 have the same configuration, and/or are manufactured by the same process, as the word line drivers WLDV. Additionally or alternatively, the tracking word lines TRKWL1-TRKWL6 have the same configuration, and/or are manufactured by the same process, as the word lines WL.

The memory device 200 further includes a logic circuit 240. The logic circuit 240 includes a plurality of inputs coupled to receive the enabling signals SAE1-SAEn of the corresponding Layer 1, Layer 2, . . . and Layer n. The logic circuit 240 is configured to generate a signal SAElast corresponding to the latest one among the enabling signals SAE1-SAEn. For example, in the specific configuration illustrated in FIG. 2A and for n=4, the logic circuit 240 includes NAND gates NAND1-NAND4 and inverters INV1-INV4 coupled alternatingly in series. NAND1-NAND4 have first inputs receiving the corresponding enabling signals SAE1-SAE4, and outputs coupled to inputs of corresponding INV1-INV4. Outputs of INV2-INV4 are coupled to second inputs of NAND1-NAND. The signal SAElast is generated at an output of INV1. A second input of NAND4 receives a control signal EN. When control signal EN is low or at logical "0," the logic circuit 240 is disabled and SAElast is low. When control signal EN is high or at logical "1," the logic circuit 240 is enabled and outputs signal SAElast at a high level when all SAE1-SAEn are high. The signal SAElast is used in operation of the memory device 200 in accordance with some embodiments as described herein.

Figure 2D:
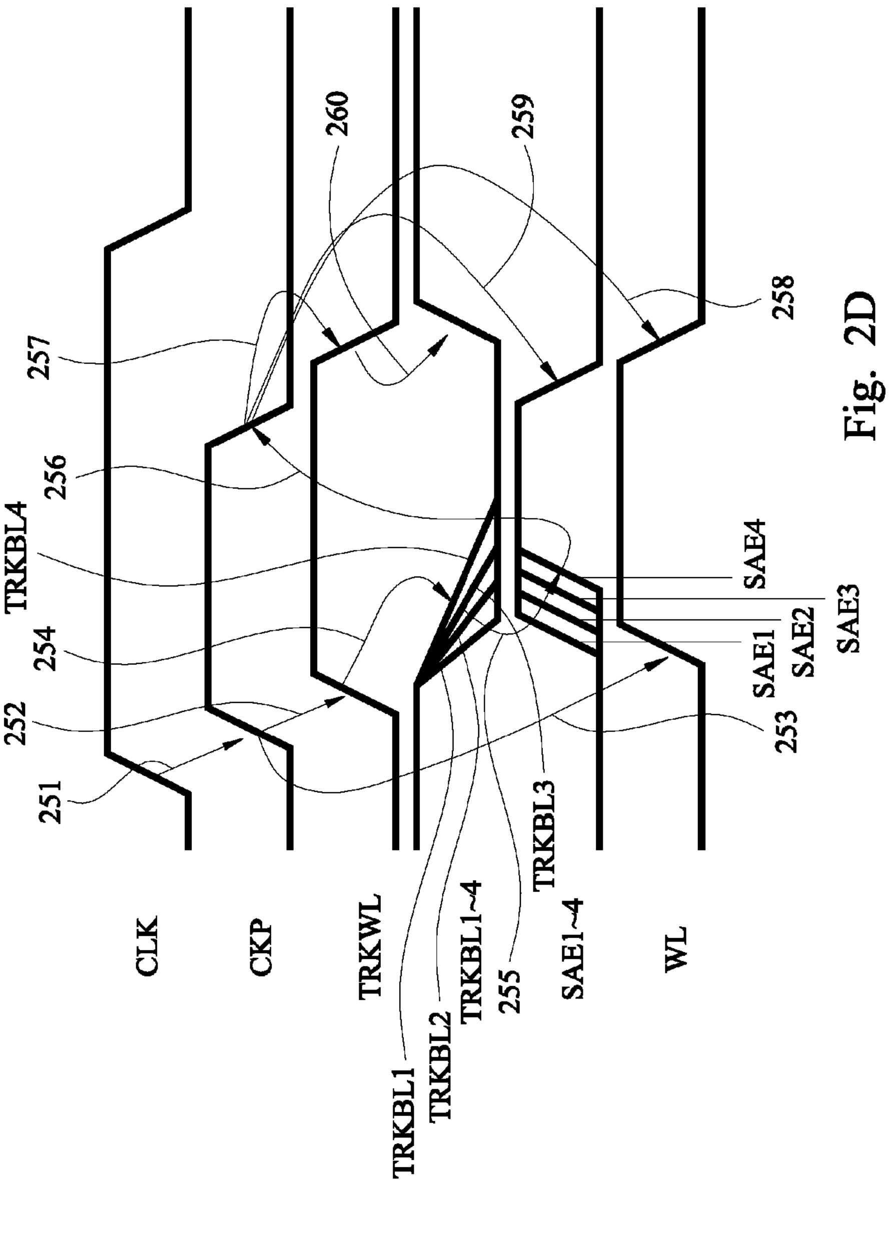
FIG. 2D is a time diagram showing a read operation of a memory device in accordance with some embodiments.

FIG. 2D is a time diagram showing a read operation of the memory device 200 in accordance with some embodiments. In the following description, a node or line and a corresponding signal on the node or line are commonly referred to using the node name. For example, WL is used interchangeably herein to denote both a word line and a signal on the word line.

A clock signal CLK is generated at a beginning of the read operation. A rising edge of the clock signal CLK causes a rising edge of a delayed clock signal CKP, as indicated by arrow 251. In some embodiments, the clock signal CLK and the delayed clock signal CKP are generated by the main control CTRL.

The rising edge of the delayed clock signal CKP causes a rising edge of a TRWL signal and a rising edge of a WL signal, as indicated by corresponding arrows 252, 253. The TRWL signal is supplied by one or more ON TRKWL Drivers to the corresponding tracking cells TRKCELL. For example, the TRKWL Driver 1 and TRKWL Driver 2, which are ON TRKWL Drivers, supply the TRWL signal, along the corresponding tracking word lines TRKWL1-TRKWL2, to the corresponding tracking cells TRKCELL in the storage layers Layer 1, Layer 2, . . . and Layer 4 (for n=4). The corresponding tracking cells TRKCELL coupled to the tracking word lines TRKWL1-TRKWL2 are selected (or enabled) by the TRWL signal and cause bit line splits to develop on the corresponding tracking bit lines TRKBL1-TRKBL4, in a manner similar to that as described with respect to FIG. 1.

Such bit line splits correspond to falling edges of signals TRKBL1-TRKBL4 caused by the rising edge of signal TRKWL, as indicated by arrow 254. In the example situation illustrated in FIG. 2D, the developing speed of bit line splitting on the tracking bit lines TRKBL1-TRKBL4 of different storage layers are different due to one or more of die-to-die variations, i.e., process corners, and the like factors.

The falling edges of signals TRKBL1-TRKBL4 cause the corresponding Local Timer 1-Local Timer 4 to generate rising edges of corresponding enabling signals SAE1-SAE4, as indicated by arrow 255. Because the falling edges of signals TRKBL1-TRKBL4 are different, the rising edges of corresponding enabling signals SAE1-SAE4 are also different and enable the corresponding sense amplifiers SA1-SA4 at different timing. The last (or latest) rising edge among the enabling signals SAE1-SAE4 corresponds to the signal SAElast generated by the logic circuit 240, and causes a falling edge of the delayed clock signal CKP, as indicated at arrow 256. The falling edge of the delayed clock signal CKP causes a falling edge of signal TRKWL, a falling edge of signal WL, and falling edges of signals SAE1-SAE4, as indicated by corresponding arrows 257, 258 and 259. The falling edge of signal TRKWL causes rising edges of signals TRKBL1-TRKBL4, as indicated by arrow 260.

During the duration of the signal WL, one of the word line drivers WLDV selected by X-DEC and Y-DEC enables a read operation of the corresponding memory cells MC in the storage layers Layer 1, Layer 2, . . . and Layer 4. For example, the WLDV 230 is selected and enables a read operation of the memory cells MC coupled to the word line WL. The enabled (or selected) memory cells MC cause bit line splits on the corresponding bit lines to develop as described with respect to FIG. 1. Such bit line splitting speed on different storage layers are potentially different due to process corners (die-to-die variations) and the like factors. In accordance with some embodiments, the behavior of memory cells MC and/or bit lines in each of the storage layers is tracked by the tracking cells TRKCELL and/or tracking bit lines TRKBL in the same layer. The sense amplifiers in the storage layers are enabled at different timings based on the tracked behaviors of the corresponding storage layers, to ensure that the corresponding bit line splits are sufficiently developed when the sense amplifiers are enabled. As a result, one or more embodiments achieve intended performance while covering die-to-die (or storage layer-to-storage layer) variations in a 3D memory device.

One or more embodiments achieve enhanced performance not only in read operations, but also in write operations. Specifically, characteristics of the memory cells and/or the bit lines contribute not only to read operation performance, but also to write operation performance. As a result, by tracking characteristics of the tracking cells and/or the tracking bit lines, which emulate corresponding characteristics of the memory cells and/or the bit lines in the same storage layer, one or more embodiments control not only read margin, but also write margin of the memory device.

In one or more embodiments, the worst case time delay is covered by the tracking mechanism. For example, the worst case time delay in the read operation described with respect to FIG. 2D corresponds to the slowest storage layer with the latest enabling signal SAE. The latest enabling signal SAE is determined by the logic circuit 240 and is used to control the falling edge of the signal WL and the enabling signal SAE. As a result, one or more embodiments provide the signal WL and the enabling signal SAE with appropriate durations for a bit line split on the slowest storage layer to sufficiently develop and to be detected by the corresponding sense amplifier, ensuring the read data is accurate. The described signal propagation and/or signal timing and/or signal naming are examples. Other arrangements are within the scope of various embodiments.

In one or more embodiments, the tracking word line drivers are arranged in the same layer (or die), and/or have the same configuration, and/or are manufactured by the same process as the word line drivers. Further, the tracking word lines have the same configuration, and/or are manufactured by the same process, as the word lines. As a result, characteristics of the word line drivers and/or the word lines, which also contribute to read and/or write performance of the memory device, are emulated by the tracking word line drivers and/or the tracking word lines to achieve, in at least one embodiment, enhanced control of read and/or write margins.

In one or more embodiments, the number of selected (or enabled or activated) tracking cells in each storage layer is defined by the number of ON tracking word line drivers. For example, in the specific configuration of FIG. 2A, with two ON tracking word line drivers TRKWL Driver 1 and TRKWL Driver 2, there are two selected (or activated) tracking cells TRKCELL in each of storage layers Layer 1, Layer 2, . . . and Layer n. Other, unselected tracking cells TRKCELL are not activated due to the corresponding OFF tracking word line drivers TRKWL Driver 3-TRKWL Driver 6. As a result, all tracking cells TRKCELL in accordance with some embodiments are of the same programmable or selectable type which simplifies the manufacturing process. Other approaches manufacture the tracking cells in two different types, including OFF tracking cells with inputs tied low and ON tracking cells with input tied high. Compared with such other approaches, the manufacture of a memory device, in accordance with some embodiments, with a single type of tracking cells across all storage layers is simpler.

In one or more embodiments, the number of ON tracking word line drivers is determined during the design stage of the memory device. For example, for each storage layer, a tracking time delay between the rising edge of signal WL and the rising edge of the enabling signal SAE is determined based on a statistical distribution of time delays of the memory cells in the storage layer. In at least one embodiment, the tracking time delay is an $m-\sigma$ value of the time delays of the memory cells, where m is a positive integer. In at least one embodiment, m is determined by how high a yield is required in practical manufacture. In an example configuration, m=6. The $m-\sigma$ value is considered to cover the worst case time delay of the memory cells. By enabling the sense amplifier after the tracking time delay of at least the $m-\sigma$ value from the rising edge of signal WL, the bit line split is considered sufficiently developed to be sensed by the sense amplifier for all memory cells in the storage layer. A simulation is performed with one or more ON tracking word line drivers to determine whether the tracking time delay caused by the one or more ON tracking word line drivers is at least the $m-\sigma$ value of the corresponding storage layer. If the tracking time delay is not sufficient for at least one of the storage layers, one or more tracking word line drivers are configured to be ON. The process is repeated until the worst case time delay is covered, i.e., until the tracking time delays are sufficient in all storage layers. The memory device so designed is then passed to manufacture.

Figure 3:
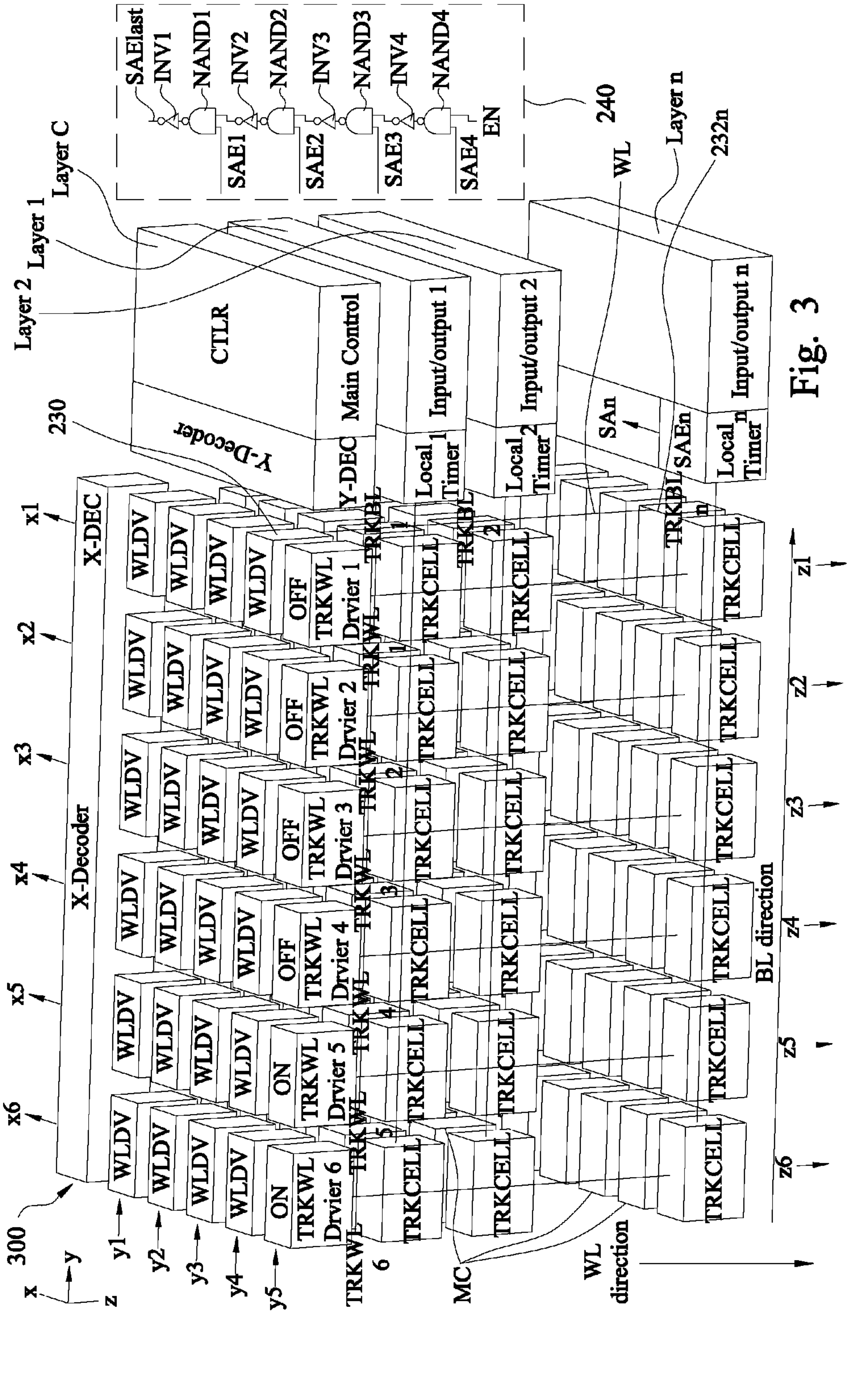
FIG. 3 is a schematic, perspective view of a memory device with a tracking mechanism in accordance with some embodiments.

FIG. 3 is a schematic, perspective view of a memory device 300 with a tracking mechanism in accordance with some embodiments. One or more differences between the memory device 300 and the memory device 200 are described herein.

In memory device 300, the ON TRKWL Drivers are placed at far end sides of both X-DEC and Y-DEC to track the worst case time delay(s) of X-DEC and/or Y-DEC. For example, TRKWL Driver 5 and TRKWL Driver 6 are configured to be ON, whereas the remaining TRKWL Drivers are configured to be OFF. X-DEC is configured to scan (or enable or select) the word line drivers WLDV in sequence from row x1 to row x6. Y-DEC is configured to scan (or enable or select) the word line drivers WLDV in sequence from row y1 to row y4. By arranging the ON TRKWL Driver(s) at ends of the scanning sequences of X-DEC and/or Y-DEC, one or more embodiments ensure that the worst case time delay(s) of X-DEC and/or Y-DEC is/are covered by the tracking mechanism.

In at least one embodiment, the design stage of the memory device 300 includes a simulation with the farthest TRKWL Driver, i.e., TRKWL Driver 6, configured to be ON. If the tracking time delay is insufficient for at least one of the storage layers, the second farthest TRKWL Driver, i.e., TRKWL Driver 5, is configured to be ON and the simulation is repeated. The TRKWL Drivers are sequentially configured to be ON in the BL direction until the tracking time delays in all storage layers are sufficient to cover the worst case time delay.

Figure 4:
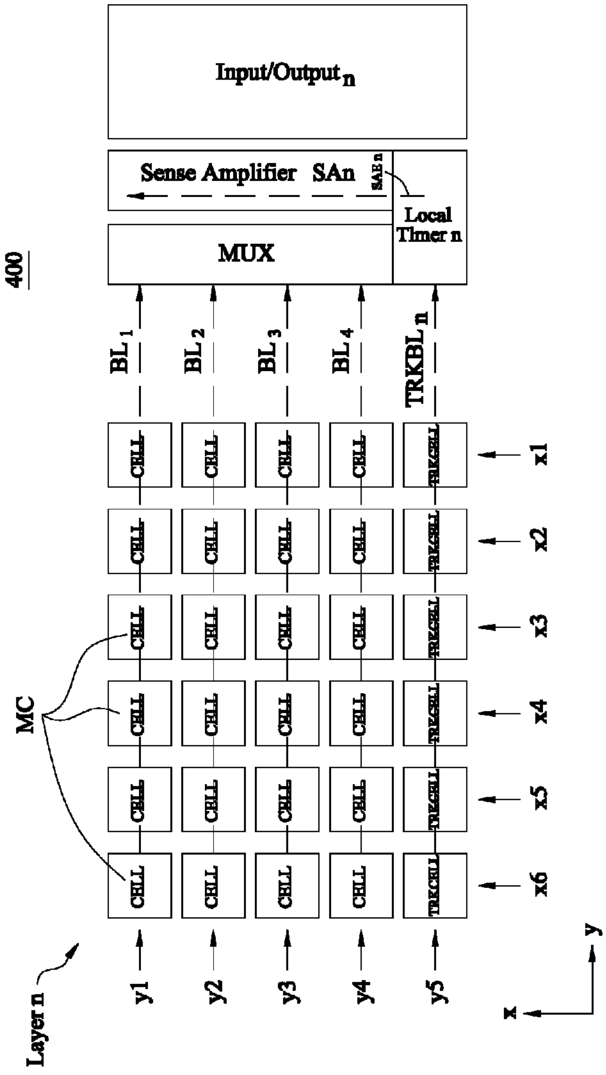
FIG. 4 is a top view of a storage layer in a memory device in accordance with some embodiments.

FIG. 4 is a top view of a storage layer, e.g., Layer n, in a memory device 400 in accordance with some embodiments. One or more differences between Layer n in the memory device 400 and Layer n in the memory device 200 are described herein. In some embodiments, a multiplexer MUX is arranged between the bit lines BL1-BL4 and the sense amplifier SAn. The MUX sequentially couples the bit lines BL1-BL4 to the sense amplifier SAn. As a result, one sense amplifier is configured to detect data from memory cells MC coupled to multiple bit lines, saving die areas in one or more embodiments. In some embodiments, one or more multiplexers are arranged in one or more other storage layers. The number of multiplexers in each storage layer and/or the number of bit lines coupled to each multiplexer in the specific configuration of FIG. 4 is/are examples. Other numbers of multiplexers in each storage layer and/or other numbers of bit lines coupled to each multiplexer are within the scope of various embodiments.

Figure 5A:
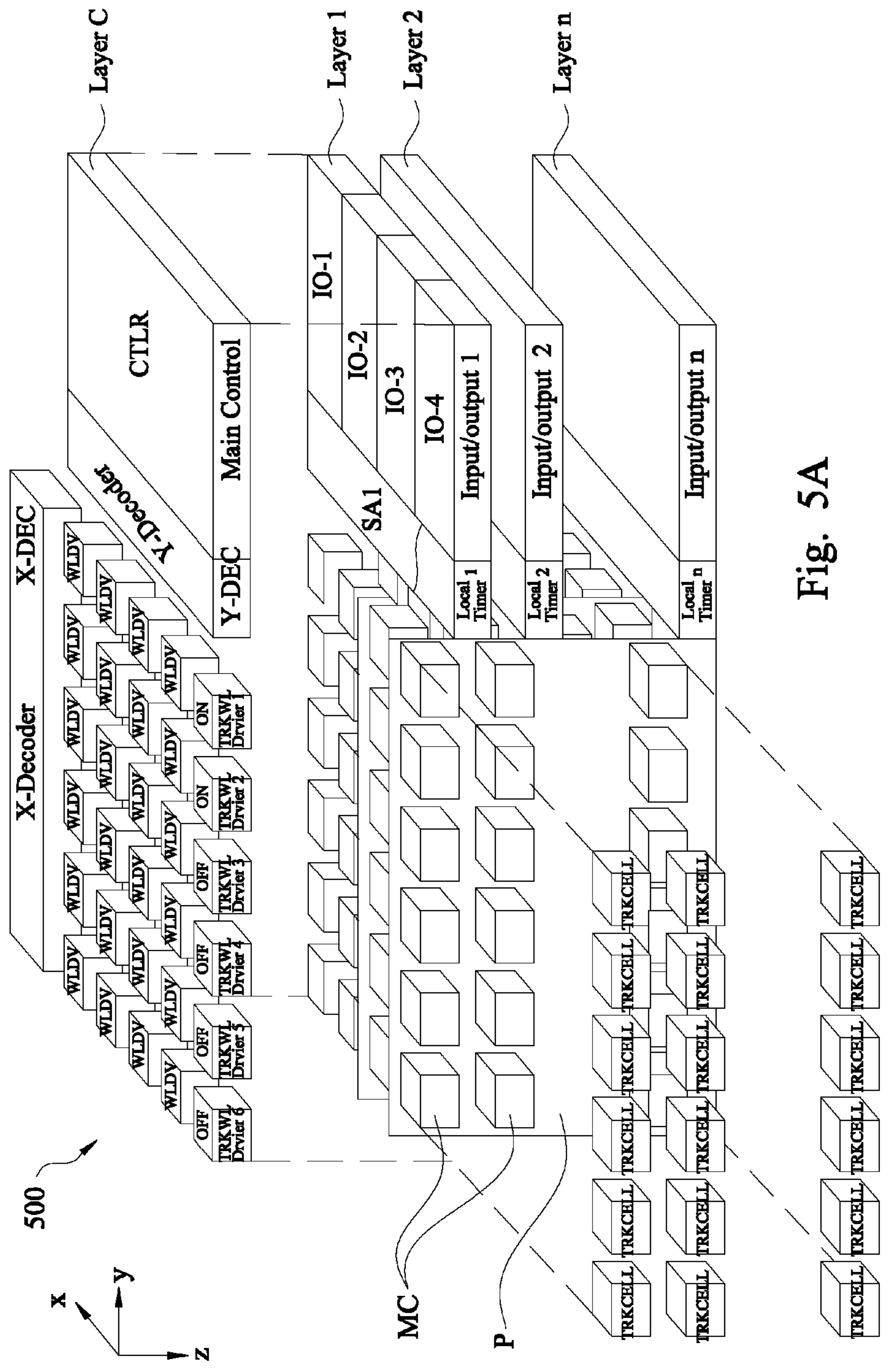
FIG. 5A is a schematic, partially exploded perspective view of a memory device with a tracking mechanism in accordance with some embodiments.
Figure 5B:
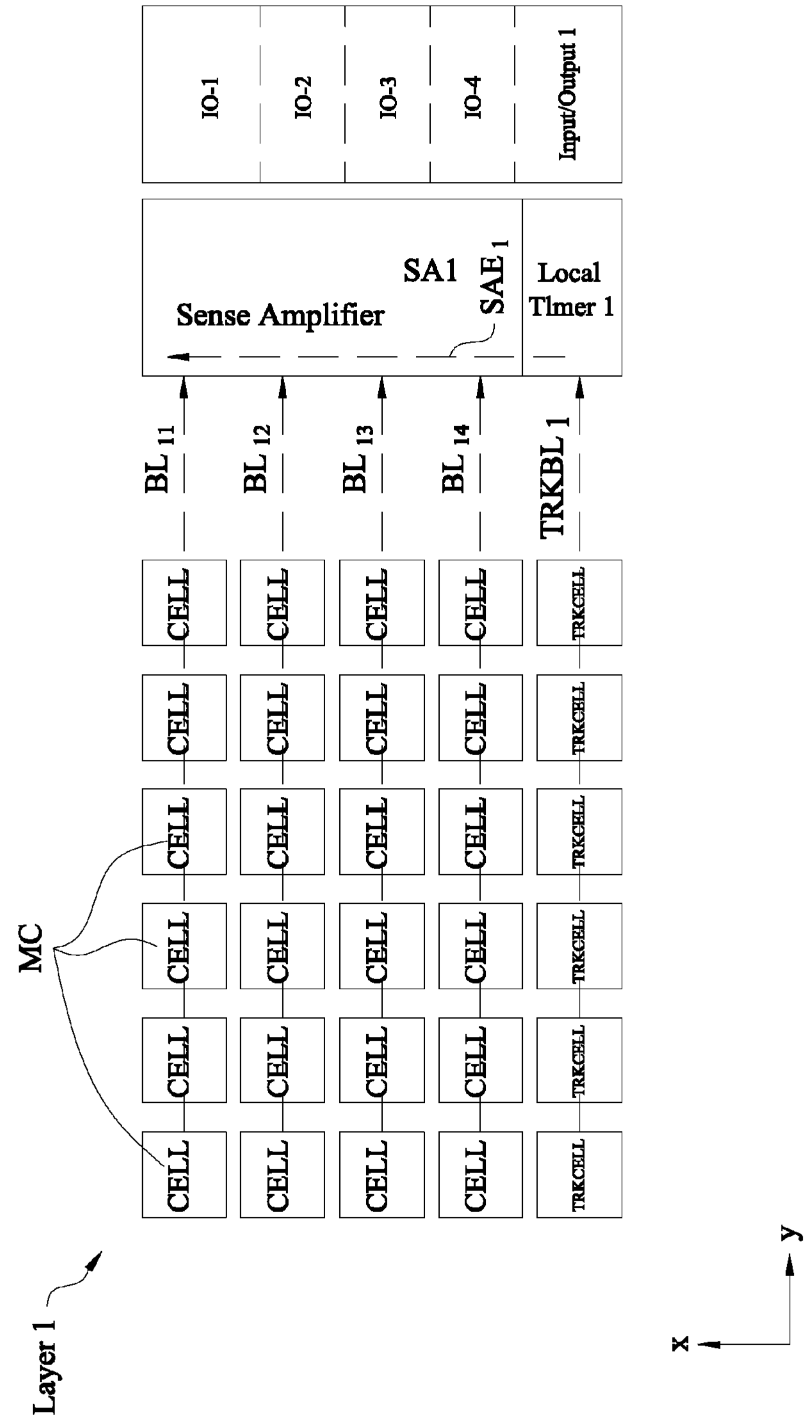
FIG. 5B is a top view of a storage layer in the memory device of FIG. 5A.
Figure 5C:
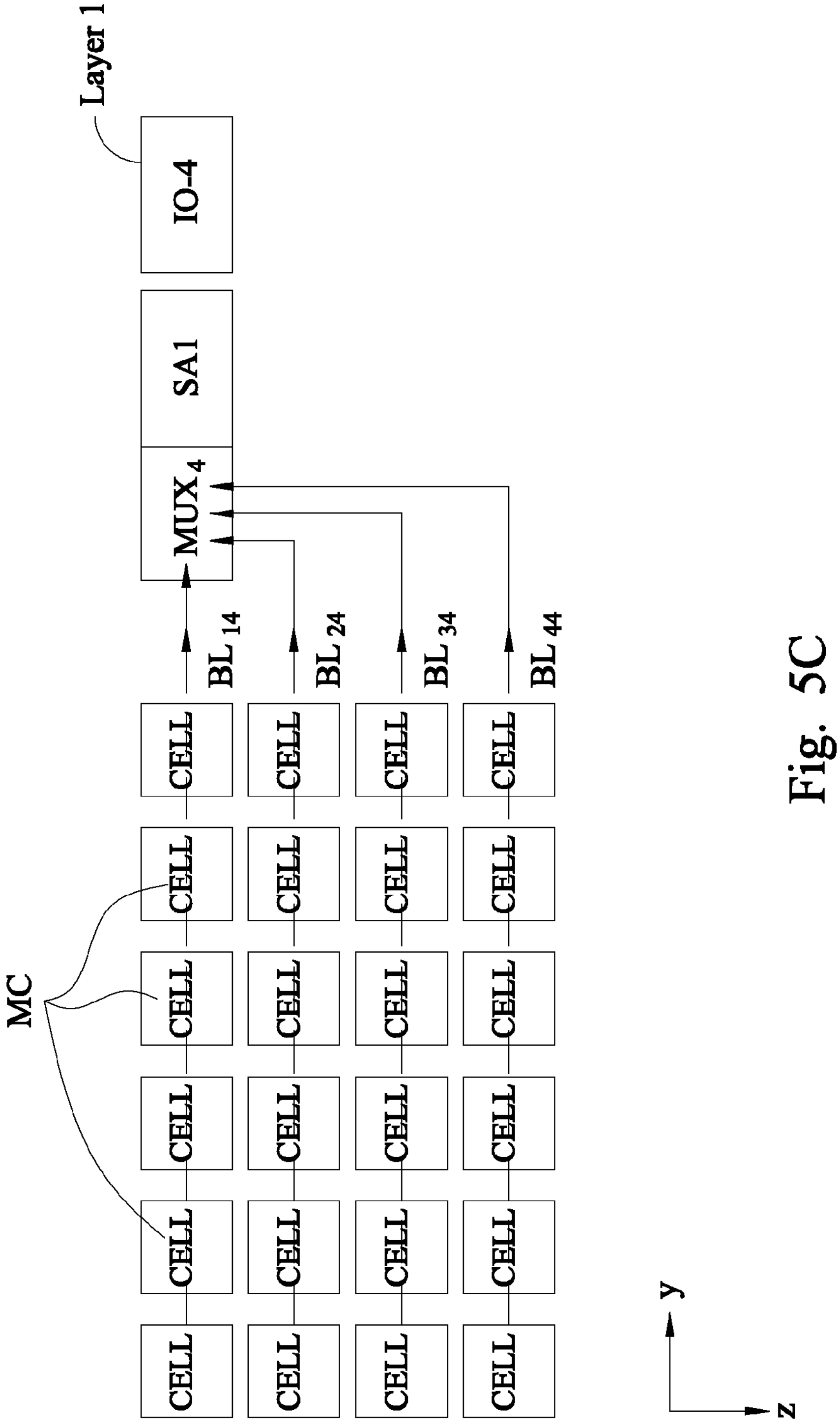
FIG. 5C is a cross-section view of the memory device taken along plane P in FIG. 5A.

FIG. 5A is a schematic, partially exploded perspective view of a memory device 500 with a tracking mechanism in accordance with some embodiments, FIG. 5B is a top view of a storage layer, e.g., Layer 1, in the memory device 500, and FIG. 5C is a cross-section view of the memory device 500 taken along plane P in FIG. 5A. One or more differences between the memory device 500 and the memory devices 200 and 400 are described herein. Compared to the memory device 400 where a multiplexer couples the bit lines in the same storage layer to a common sense amplifier, a multiplexer in the memory device 500 couples the bit lines in different storage layers to a common sense amplifier.

The memory device 500 differs from the memory device 200 in that one storage layer contains input/output circuits common for more than one storage layers. For example, Layer 1 includes common input/output circuits IO-1, IO-2, IO-3 and IO-4 for all storage layers Layer 1-Layer n.

As illustrated in FIG. 5B, Input/Output 1 of Layer 1 includes IO-1, IO-2, IO-3 and IO-4. IO-1 is coupled via one or more sense amplifiers SA1 to the bit line BL11 of Layer 1, and the corresponding bit lines in Layer 2-Layer n. IO-2 to IO-4 are coupled via one or more sense amplifiers SA1 to the corresponding bit lines BL12 to BL14 of Layer 1, and the corresponding bit lines in Layer 2-Layer n. For example, as illustrated in FIG. 5C, bit lines BL14 of Layer 1, and the corresponding bit lines BL2-4, BL34 and BL44 in the corresponding Layer 2-Layer n (for n=4) are coupled to the one or more common sense amplifiers SA1 via a multiplexer MUX4. The MUX4 sequentially couples the bit lines BL14-BL44 to the sense amplifier SA1. As a result, one sense amplifier is configured to detect data from memory cells MC coupled to multiple bit lines of multiple storage layers, saving die areas in one or more embodiments. In some embodiments, one or more multiplexers are arranged in one or more of IO-1 to IO-3 and coupled to the corresponding bit lines in the different storage layers. The number of multiplexers and/or the number of bit lines coupled to each multiplexer in the specific configuration of FIGS. 5A-5C is/are examples. Other numbers of multiplexers in each storage layer and/or other numbers of bit lines coupled to each multiplexer are within the scope of various embodiments.

Figure 6:
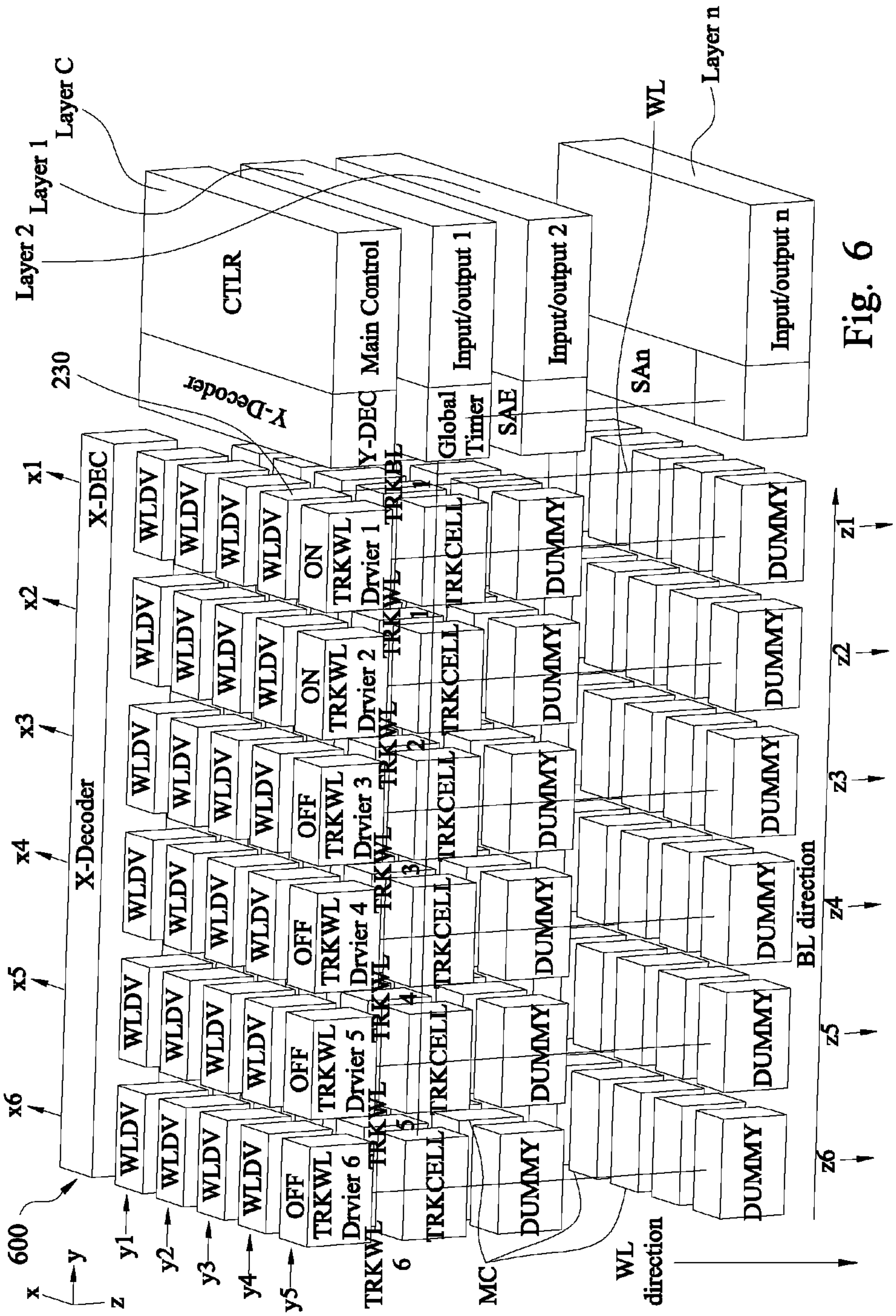
FIG. 6 is a schematic, perspective view of a memory device with a tracking mechanism in accordance with some embodiments.

FIG. 6 is a schematic, perspective view of a memory device 600 with a tracking mechanism in accordance with some embodiments. One or more differences between the memory device 600 and the memory device 200 are described herein. Compared to the memory device 200 where each storage layer includes a tracking bit line and tracking cells, not all storage layers in memory device 600 include a tracking bit line and tracking cells. For example, Layer 1 in memory device 600 includes a tracking bit line TRKBL 1 and the corresponding tracking cells TRKCELL coupled to the tracking bit line TRKBL 1. Other storage layers, i.e., Layer 2 to Layer n, include dummy cells DUMMY instead of tracking cells.

In at least one embodiment, dummy cells DUMMY are coupled to the corresponding TRKWL Driver 1-TRKWL Driver 6 and the corresponding tracking cells TRKCELL in Layer 1 via the corresponding tracking word lines TRKWL1-TRKWL6. In at least one embodiment, dummy cells DUMMY have the same configuration, and/or are manufactured by the same process, as memory cells MC in the same storage layer. However, dummy cells DUMMY are not configured to track the behavior of the memory cells MC. In an example, tracking bit lines are omitted in storage layers with dummy cells DUMMY. In another example, tracking bit lines are arranged in storage layers with dummy cells DUMMY and coupled to the corresponding dummy cells DUMMY; however, such tracking bit lines (referred to as dummy tracking bit lines) are not coupled to timers and/or enabling terminals of the corresponding sense amplifiers so that bit line splits on the dummy tracking bit lines do not result in corresponding enabling signals for the sense amplifiers. Instead, the sense amplifiers in various storage layers are coupled to a Global Timer which is coupled to the tracking bit line TRKBL 1 and configured to generate a global enabling signal SAE for sense amplifiers in more than one storage layer. In the specific configuration illustrated in FIG. 6, the global enabling signal SAE from the Global Timer is coupled to the enabling terminal of the sense amplifiers in all storage layers Layer 1 to Layer n. Other arrangements are within the scope of various embodiments. For example, in one or more embodiments, more than one, but not all, storage layers include tracking cells TRKCELL and corresponding tracking bit lines and local timers. In one or more embodiments, a local timer is coupled to corresponding tracking cells TRKCELL and a tracking bit line, and is configured to generate an enabling signal for sense amplifiers in more than one, but not all, storage layers.

In at least one embodiment, dummy cells DUMMY are coupled to the tracking word lines and permit tracking the behavior of word lines WL and the corresponding word line drivers. As a result, although the dummy cells DUMMY do not contribute to tracking the behavior of memory cells and the corresponding bit lines, the behavior of word lines and the corresponding word line drivers is taken into account and improve control of read and/or write margins.

Figure 7:
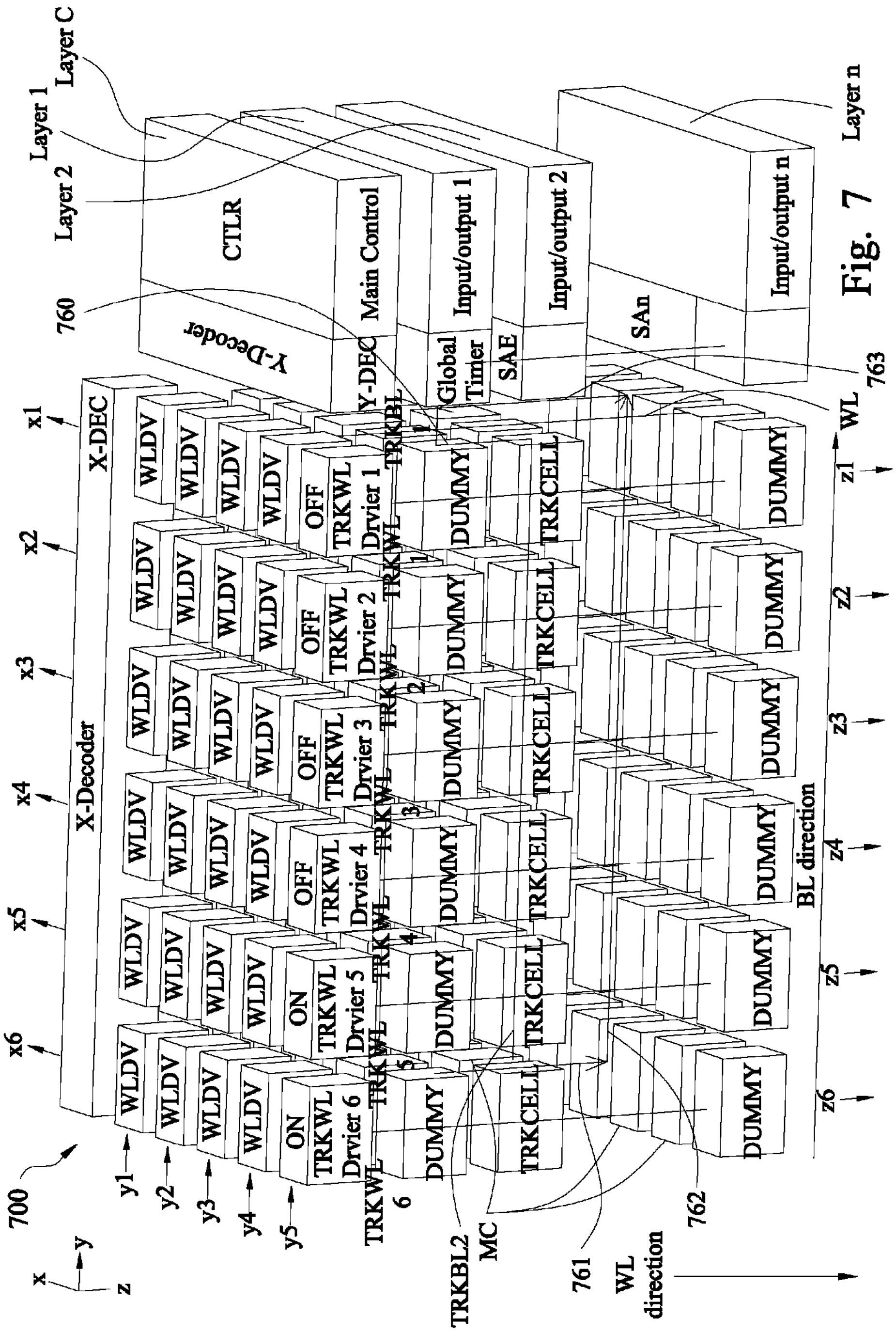
FIG. 7 is a schematic, perspective view of a memory device with a tracking mechanism in accordance with some embodiments.

FIG. 7 is a schematic, perspective view of a memory device 700 with a tracking mechanism in accordance with some embodiments. One or more differences between the memory device 600 and the memory device 700 are described herein. Compared to the memory device 600 where the tracking cells TRKCELL and the Global Timer are arranged in the same storage layer, the tracking cells TRKCELL and the Global Timer of the memory device 700 are arranged in different storage layers. For example, Layer 2 in memory device 700 includes a tracking bit line TRKBL2 and the corresponding tracking cells TRKCELL coupled to the tracking bit line TRKBL2, whereas the Global Timer is arranged in a different storage layer, i.e., Layer 1. The TRKBL2 is coupled to the Global Timer by a conductor 760 extending in the Z direction. The signals travel in the tracking mechanism as indicated by arrows 761, 762 and 763. The returning of the tracking signal from Layer 2 to Layer 1 in one or more embodiments compensates for the resistance effect of the word line WL. In at least one embodiment, tracking cells TRKCELL corresponding to the OFF TRKWL Drivers are not turned on, and prevent tracking bit line leakage.

Embodiments that combine different features and/or different embodiments are within the scope of the disclosure and will be apparent to those of ordinary skill in the art after reviewing various embodiments.

Some embodiments provide a 3D tracking mechanism for a 3D memory device, to control read and/or write margins. In some embodiments, each storage layer has its own tracking cells and tracking bit line for self-timing margin control. In some embodiments, the number of tracking cells to be selected or activated is determined by corresponding ON tracking word line drivers, which permits a single type of tracking cells to be used across the memory device for simplified 3D processes. In some embodiments, tracking cells and tracking bit line in one storage layer are used to generate sense amplifier enabling signals for other storage layers. In one or more embodiments, the tracking mechanism is applicable to various memory types and/or stack types of 3D memory devices.

In some embodiments, a memory device comprises storage layers each comprising memory cells arranged in a plurality of rows, bit lines coupled to the memory cells in the corresponding rows, tracking cells arranged in at least one row, at least one tracking bit line coupled to the tracking cells, and at least one sense amplifier coupled to the bit lines. The sense amplifier is configured to detect data stored in the memory cells, and has an enabling terminal coupled to the at least one tracking bit line. The memory device further comprises word lines and tracking word lines extending through the storage layers. The word lines are coupled to the corresponding memory cells in the storage layers. The tracking word lines are coupled to the corresponding tracking cells in the storage layers.

In some embodiments, a memory device comprises storage layers each comprising memory cells arranged in a plurality of rows, bit lines coupled to the memory cells in the corresponding rows, and at least one sense amplifier coupled to the bit lines. The sense amplifier is configured to detect data stored in the memory cells, and has an enabling terminal. The memory device further comprises word lines and a logic circuit. The word lines extend through the storage layers, and are coupled to the corresponding memory cells in the storage layers. The logic circuit has an input and an output, the output coupled to the enabling terminals of the sense amplifiers in more than one of the storage layers. A first storage layer among the storage layers further comprises tracking cells arranged in at least one row, and at least one tracking bit line coupled to the tracking cells. The at least one tracking bit line is coupled to the input of the logic circuit. The logic circuit is configured to generate an enabling signal for enabling the corresponding sense amplifiers in accordance with a voltage on the at least one tracking bit line.

In some embodiments, a memory device comprises storage layers each comprising memory cells arranged in a plurality of rows, bit lines coupled to the memory cells in the corresponding rows, and at least one sense amplifier coupled to the bit lines. The sense amplifier is configured to detect data stored in the memory cells, and has an enabling terminal. The memory device further comprises word lines, tracking word lines and tracking word line drivers. The word lines extend through the storage layers, and are coupled to the corresponding memory cells in the storage layers. The tracking word lines extend through the storage layers. The tracking word line drivers are coupled to the corresponding tracking word lines. A first storage layer among the storage layers further comprises tracking cells and at least one tracking bit line coupled to the tracking cells. The tracking cells are arranged in at least one row and coupled to the corresponding tracking word line drivers via the corresponding tracking word lines. The at least one tracking bit line is coupled to the enabling terminal of at least one of the sense amplifiers in the storage layers. At least one of the tracking word line drivers is configured to enable the corresponding tracking word line and the corresponding tracking cell in a read operation of any of the memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

storage layers each comprising:

memory cells arranged in a plurality of rows, bit lines coupled to the memory cells in the corresponding rows, tracking cells arranged in at least one row, at least one tracking bit line coupled to the tracking cells, and at least one sense amplifier coupled to the bit lines and configured to detect data stored in the memory cells, the at least one sense amplifier having an enabling terminal coupled to the at least one tracking bit line;

word lines extending through the storage layers, and coupled to the corresponding memory cells in the storage layers; and tracking word lines extending through the storage layers, and coupled to the corresponding tracking cells in the storage layers.

2. The memory device of claim 1, wherein each of the storage layers further comprises:

a first logic circuit having an input and an output, the input coupled to the at least one tracking bit line, the output coupled to the enabling terminal of the sense amplifier, the first logic circuit configured to generate an enabling signal for enabling the sense amplifier in accordance with a voltage on the at least one tracking bit line.

3. The memory device of claim 2, further comprising:

a second logic circuit having inputs coupled to the corresponding outputs of the first logic circuits, the second logic circuit configured to generate an output signal corresponding to the latest one among the enabling signals generated by the first logic circuits.

4. The memory device of claim 1, further comprising:

a control layer comprising:

word line drivers coupled to the corresponding word lines, and tracking word line drivers coupled to the corresponding tracking word lines.

5. The memory device of claim 4, wherein at least one of the tracking word line drivers is configured to enable the corresponding tracking word line and the corresponding tracking cells in a read operation of any of the memory cells.

6. The memory device of claim 5, wherein at least another one of the tracking word line drivers is configured to disable the corresponding tracking word line and the corresponding tracking cells in the read operation of any of the memory cells.

7. The memory device of claim 4, wherein the tracking word line drivers are free of direct electrical connections with each other.

8. The memory device of claim 4, wherein the control layer further comprises:

first address signal lines coupled to the corresponding word line drivers in a first direction, second address signal lines coupled to the corresponding word line drivers in a second direction transverse to the first direction, a first decoder coupled to the first address signal lines, and a second decoder coupled to the second address signal lines.

9. The memory device of claim 8, wherein the tracking word line drivers are free of direct electrical connections to the first and second address signal lines.

10. The memory device of claim 8, wherein the first decoder is configured to scan the first address signal lines in a first sequence, the second decoder is configured to scan the second address signal lines in a second sequence, and at least one of the tracking word line drivers is configured to enable the corresponding tracking word line and the corresponding tracking cells in a read operation of any of the memory cells, the at least one tracking word line driver located at a location corresponding to ends of the first and second sequences.

11. The memory device of claim 4, further comprising:

dies containing the corresponding storage layers and control layer, wherein the dies are stacked one on top another into a three-dimensional memory device.

12. The memory device of claim 1, wherein the tracking bit lines and the bit lines in the storage layers are parallel to each other, and the tracking word lines and the word lines are parallel to each other.

13. The memory device of claim 1, wherein at least one of the storage layers further comprises:

a multiplexer having inputs coupled to more than one of the bit lines in the at least one storage layer, and an output coupled to the at least one sense amplifier in the at least one storage layer.

14. The memory device of claim 1, further comprising:

a multiplexer having inputs coupled to the corresponding bit lines in more than one of the storage layers, and an output coupled to the at least one sense amplifier in one of the storage layers.

15. A memory device, comprising:

storage layers each comprising:

memory cells arranged in a plurality of rows, bit lines coupled to the memory cells in the corresponding rows, and at least one sense amplifier coupled to the bit lines and configured to detect data stored in the memory cells, the at least one sense amplifier having an enabling terminal;

word lines extending through the storage layers, and coupled to the corresponding memory cells in the storage layers; and a logic circuit having an input and an output, the output coupled to the enabling terminals of the sense amplifiers in more than one of the storage layers;

wherein a first storage layer among the storage layers further comprises:

tracking cells arranged in at least one row, and at least one tracking bit line coupled to the tracking cells, the at least one tracking bit line coupled to the input of the logic circuit, the logic circuit configured to generate an enabling signal for enabling the corresponding sense amplifiers in accordance with a voltage on the at least one tracking bit line.

16. The memory device of claim 15, wherein the logic circuit is located in the first storage layer.

17. The memory device of claim 15, wherein the logic circuit is located in a second storage layer among the storage layers, the second storage layer different from the first storage layer.

18. The memory device of claim 15, wherein a second storage layer among the storage layers further comprises dummy cells, the second storage layer different from the first storage layer, and the memory device further comprises tracking word lines extending through the storage layers, the tracking word lines coupled to the corresponding tracking cells in the first storage layer and to the corresponding dummy cells in the second storage layer.

19. A memory device, comprising:

storage layers each comprising:

memory cells arranged in a plurality of rows, bit lines coupled to the memory cells in the corresponding rows, and at least one sense amplifier coupled to the bit lines and configured to detect data stored in the memory cells, the at least one sense amplifier having an enabling terminal;

word lines extending through the storage layers, and coupled to the corresponding memory cells in the storage layers;

tracking word lines extending through the storage layers; and tracking word line drivers coupled to the corresponding tracking word lines, wherein a first storage layer among the storage layers further comprises:

tracking cells arranged in at least one row and coupled to the corresponding tracking word line drivers via the corresponding tracking word lines, and at least one tracking bit line coupled to the tracking cells, the at least one tracking bit line coupled to the enabling terminal of at least one of the sense amplifiers in the storage layers; and at least one of the tracking word line drivers is configured to enable the corresponding tracking word line and the corresponding tracking cell in a read operation of any of the memory cells.

20. The memory device of claim 19, wherein at least another one of the tracking word line drivers is configured to disable the corresponding tracking word line and the corresponding tracking cell in the read operation of any of the memory cells.

* * * * *